United States Patent
Lin et al.

(10) Patent No.: US 10,854,555 B1
(45) Date of Patent: Dec. 1, 2020

(54) METHOD OF MANUFACTURING MARK

(71) Applicant: Powerchip Semiconductor Manufacturing Corporation, Hsinchu (TW)

(72) Inventors: Hsiao-Chiang Lin, New Taipei (TW); Chia-Kuang Lee, Hsinchu (TW); Shih-Ci Yen, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/575,395

(22) Filed: Sep. 19, 2019

(30) Foreign Application Priority Data

Jul. 5, 2019 (TW) .............................. 108123773 A

(51) Int. Cl.
*H01L 21/311* (2006.01)
*H01L 23/544* (2006.01)
*H01L 21/768* (2006.01)

(52) U.S. Cl.
CPC ........ *H01L 23/544* (2013.01); *H01L 21/7684* (2013.01); *H01L 21/76807* (2013.01); *H01L 21/76843* (2013.01); *H01L 2223/54426* (2013.01)

(58) Field of Classification Search
CPC ........... H01L 21/3212; H01L 21/31053; H01L 21/76877; H01L 23/544; H01L 2224/05095; H01L 2224/83121; H01L 23/53238; H01L 24/03
See application file for complete search history.

(56) References Cited

U.S. PATENT DOCUMENTS

| 6,465,897 | B1 | 10/2002 | Shih et al. |
| 6,780,775 | B2 | 8/2004 | Ning |
| 8,080,886 | B2* | 12/2011 | Kang ..................... G03F 9/708 257/797 |
| 8,324,742 | B2 | 12/2012 | Summerfelt et al. |

(Continued)

FOREIGN PATENT DOCUMENTS

| CN | 1638089 | 7/2005 |
| CN | 106575638 | 4/2017 |
| TW | 569327 | 1/2004 |

OTHER PUBLICATIONS

"Office Action of Taiwan Counterpart Application", dated Feb. 27, 2020, p. 1-p. 6.

*Primary Examiner* — Jaehwan Oh
(74) *Attorney, Agent, or Firm* — JCIPRNET

(57) ABSTRACT

A method of manufacturing a mark including the following steps is provided. A substrate including a device area and a mark area is provided. A dielectric layer is formed on the substrate. A dual damascene opening is formed in the dielectric layer of the device area. The dual damascene opening includes a first opening and a second opening connected to each other. The width of the second opening is greater than the width of the first opening. A third opening is formed in the dielectric layer of the mark area. The third opening and the first opening are simultaneously formed by the same process. A barrier material layer is formed on the surfaces of the dual damascene opening and the third opening. The barrier material layer seals the third opening to form a void in the third opening. A metal material layer is formed on the barrier material layer.

20 Claims, 7 Drawing Sheets

(56) References Cited

U.S. PATENT DOCUMENTS

| | | | |
|---|---|---|---|
| 2004/0102014 A1* | 5/2004 | Ning | H01L 28/40 438/393 |
| 2005/0196951 A1* | 9/2005 | Lin | H01L 21/31144 438/622 |
| 2015/0228605 A1* | 8/2015 | Lin | H01L 21/28556 257/761 |

* cited by examiner

METHOD OF MANUFACTURING MARK

CROSS-REFERENCE TO RELATED APPLICATION

This application claims the priority benefit of Taiwan application serial no. 108123773, filed on Jul. 5, 2019. The entirety of the above-mentioned patent application is hereby incorporated by reference herein and made a part of this specification.

BACKGROUND

Technical Field

The invention relates to a method of manufacturing a semiconductor device, and particularly relates to a method of manufacturing a mark.

Description of Related Art

In a semiconductor process, various marks (such as an alignment mark or an overlay mark) are used to assist the process to be smoothly performed. In general, the mark generates a mark signal by a step difference or a color difference. However, other film layer formed in the subsequent process may hinder the function of the mark, causing failure in obtaining the mark signal.

SUMMARY

The invention provides a method of manufacturing a mark, which may produce a mark capable of generating a distinct mark signal.

The invention provides a method of manufacturing a mark, which includes the following steps. A substrate is provided. The substrate includes a device area and a mark area. A dielectric layer is formed on the substrate. A dual damascene opening is formed in the dielectric layer of the device area. The dual damascene opening includes a first opening and a second opening connected to each other. The second opening is located above the first opening. The width of the second opening is greater than the width of the first opening. A third opening is formed in the dielectric layer of the mark area. The third opening and the first opening are simultaneously formed by the same process. A barrier material layer is formed on the surface of the dual damascene opening and on the surface of the third opening. The barrier material layer seals the third opening to form a void in the third opening. A metal material layer is formed on the barrier material layer. The metal material layer is filled in the dual damascene opening. The metal material layer and the barrier material layer outside the dual damascene opening and outside the third opening are removed to form a first barrier layer and a dual damascene structure in the dual damascene opening, and to form a second barrier layer in the third opening.

According to an embodiment of the invention, in the method of manufacturing the mark, the aspect ratio of the third opening may be greater than the aspect ratio of the dual damascene opening.

According to an embodiment of the invention, in the method of manufacturing the mark, the first opening may be a via opening.

According to an embodiment of the invention, in the method of manufacturing the mark, the second opening may be a trench.

According to an embodiment of the invention, in the method of manufacturing the mark, the third opening may be a via opening.

According to an embodiment of the invention, in the method of manufacturing the mark, the material of the barrier material layer is, for example, titanium (Ti), titanium nitride (TiN), tantalum (Ta), tantalum nitride (TaN), or a combination thereof.

According to an embodiment of the invention, in the method of manufacturing the mark, the barrier material layer may be conformally formed on the surface of the dual damascene opening and on the surface of the third opening.

According to an embodiment of the invention, in the method of manufacturing the mark, the method of forming the barrier material layer is, for example, a physical vapor deposition method or a chemical vapor deposition method.

According to an embodiment of the invention, in the method of manufacturing the mark, the thickness of the barrier material layer may be greater than half of the width of the top of the third opening.

According to an embodiment of the invention, in the method of manufacturing the mark, the thickness of the barrier material layer may be less than half of the width of the top of the dual damascene opening.

According to an embodiment of the invention, in the method of manufacturing the mark, the material of the metal material layer is, for example, copper (Cu).

According to an embodiment of the invention, in the method of manufacturing the mark, the method of forming the metal material layer is, for example, a physical vapor deposition method or an electrochemical plating (ECP) method.

According to an embodiment of the invention, in the method of manufacturing the mark, the method of removing the metal material layer and the barrier material layer outside the dual damascene opening and outside the third opening is, for example, a chemical mechanical polishing method.

According to an embodiment of the invention, in the method of manufacturing the mark, in the step of removing the metal material layer and the barrier material layer outside the dual damascene opening and outside the third opening, a portion of the dielectric layer may be removed to increase the width of the top of the third opening.

According to an embodiment of the invention, in the method of manufacturing the mark, the method of forming the dual damascene structure may be a via-first dual damascene method or a trench-first dual damascene method.

According to an embodiment of the invention, the method of manufacturing the mark further includes forming an opaque layer on the second barrier layer.

According to an embodiment of the invention, in the method of manufacturing the mark, the material of the opaque layer is, for example, Ta, TaN, Ti, TiN, aluminum (Al), Cu, tungsten (W), or a combination thereof.

According to an embodiment of the invention, in the method of manufacturing the mark, the opaque layer may have a step difference at the position of the third opening.

According to an embodiment of the invention, in the method of manufacturing the mark, the opaque layer may be conformally formed on the second barrier layer.

According to an embodiment of the invention, in the method of manufacturing the mark, the method of forming the opaque layer is, for example, a physical vapor deposition method or a chemical vapor deposition method.

Based on the above, in the method of manufacturing the mark according to the invention, since the barrier material layer seals the third opening to form the void in the third opening, the second barrier layer subsequently formed on the surface of the third opening may have the step difference, allowing the second barrier layer as the mark to generate a distinct mark signal. In addition, since the barrier material layer seals the third opening, it is possible to prevent the subsequently formed metal material layer from filling the third opening. In this way, even if the opaque layer is formed on the second barrier layer in the subsequent process, the opaque layer may have a step difference at the position of the third opening, so that the distinct mark signal may still be generated. Furthermore, since the method of manufacturing the mark according to the invention may be integrated with a dual damascene process, the mark may be produced without the need to add an additional mask.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
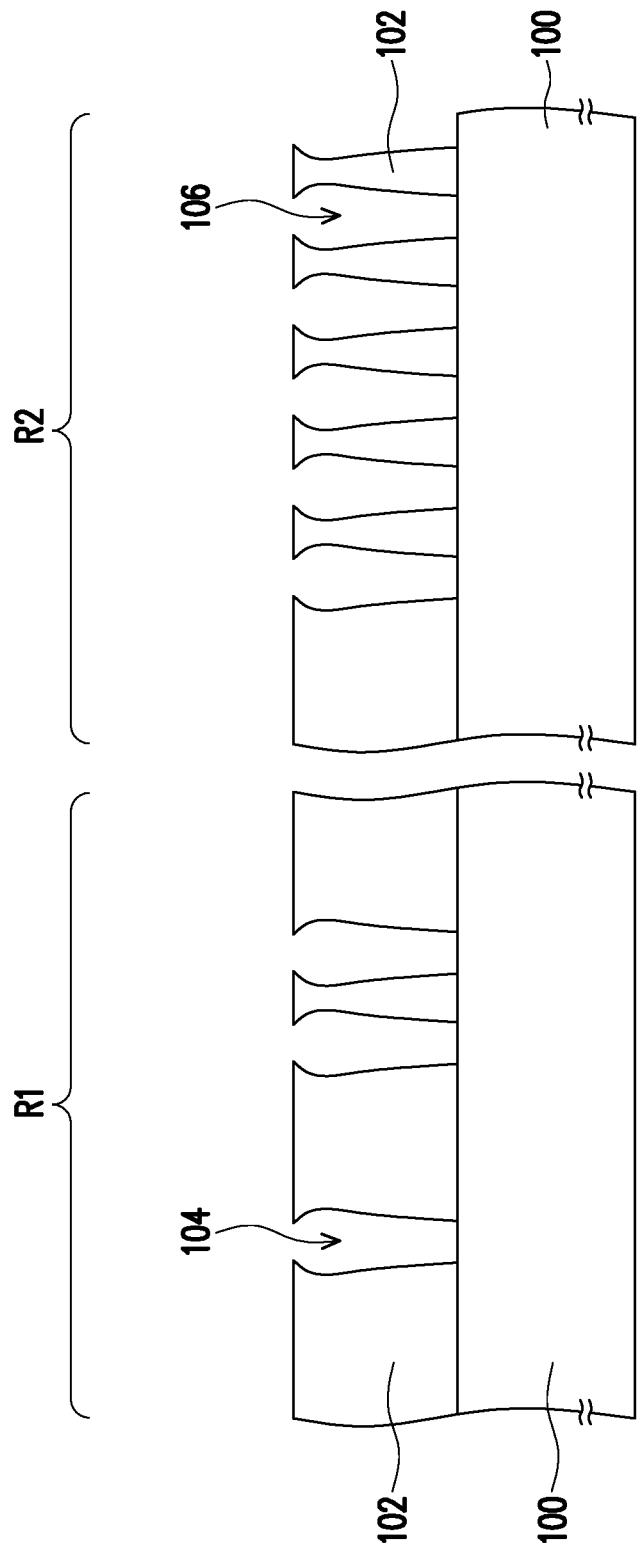
FIG. 1A to FIG. 1G are cross-sectional views illustrating a process of manufacturing a mark according to an embodiment of the invention.

Referring to FIG. 1A, a substrate 100 is provided. The substrate 100 includes a device area R1 and a mark area R2. The device area R1 may be used to form various semiconductor devices. For example, the device area R1 may be a memory cell region, but the invention is not limited thereto. In addition, the mark area R2 may be used to form marks such as an alignment mark or overlay mark.

The substrate 100 may include a semiconductor substrate (such as a silicon substrate), but the invention is not limited thereto. In some embodiments, the substrate 100 may further include a semiconductor device (such as a transistor) and a dielectric layer formed on the semiconductor substrate. In FIG. 1, the substrate 100 is shown as a single-layer structure to simplify the illustration.

A dielectric layer 102 is formed on the substrate 100. The material of the dielectric layer 102 is, for example, silicon oxide. The method of forming the dielectric layer 102 is, for example, a chemical vapor deposition method.

An opening 104 is formed in the dielectric layer 102 of the device area R1 and an opening 106 is formed in the dielectric layer 102 of the mark area R2. The opening 106 and the opening 104 are simultaneously formed by the same process. For example, the opening 106 and the opening 104 may be simultaneously formed by performing a patterning process on the dielectric layer 102. The patterning process is, for example, a combination of a lithography process and an etching process. The opening 104 and the opening 106 may respectively be a via opening, but the invention is not limited thereto. In some embodiments, the sidewall of the opening 106 may have a bowing profile.

Figure 1B:
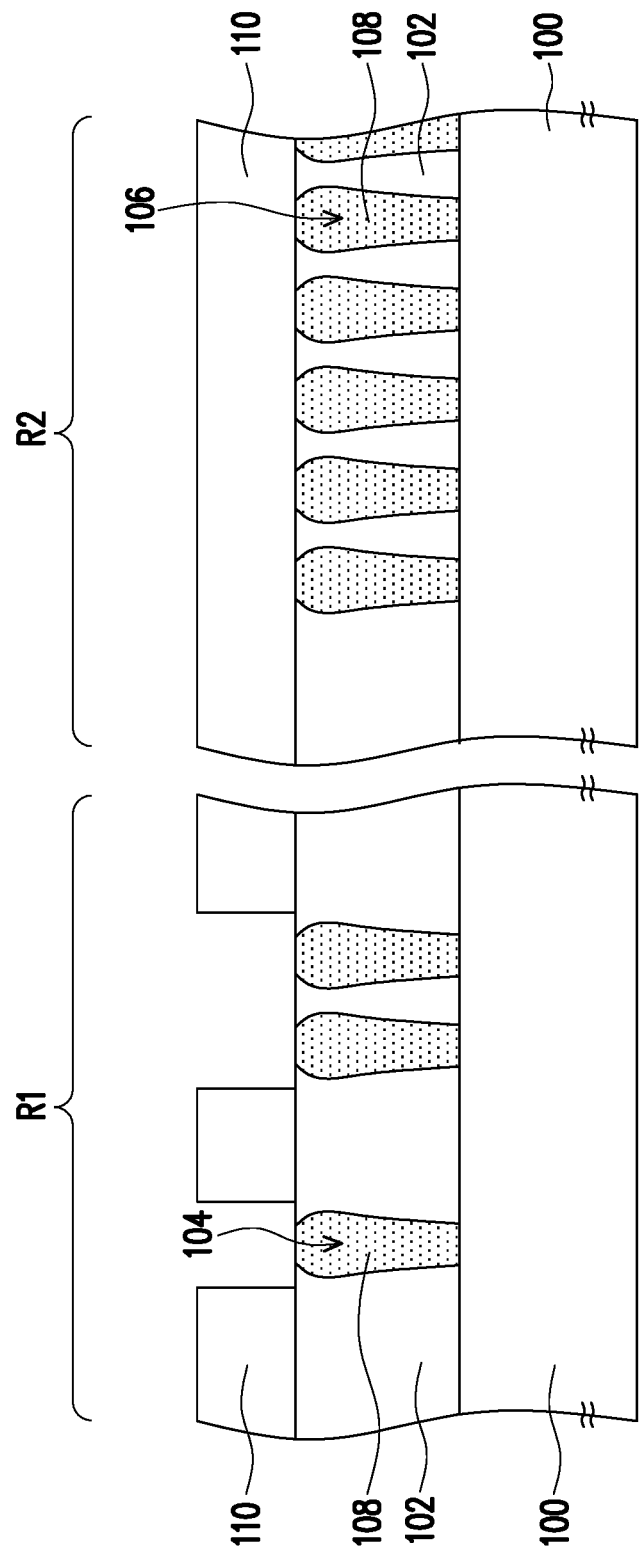

Referring to FIG. 1B, a planarization layer 108 filled in the opening 104 and the opening 106 may be formed. The material of the planarization layer 108 is, for example, a polymer. The method of forming the planarization layer 108 is, for example, forming a planarization material layer (not shown) filling the opening 104 and the opening 106 by using a spin coating method first, and then performing an etch back process on the planarization material layer, but the invention is not limited thereto.

A patterned photoresist layer 110 may be formed on the dielectric layer 102. The patterned photoresist layer 110 exposes the planarization layer 108 and a portion of the dielectric layer 102 in the device area R1. In addition, the patterned photoresist layer 110 covers the planarization layer 108 and the dielectric layer 102 in the mark area R2. The patterned photoresist layer 110 may be formed by a lithography process.

Figure 1C:
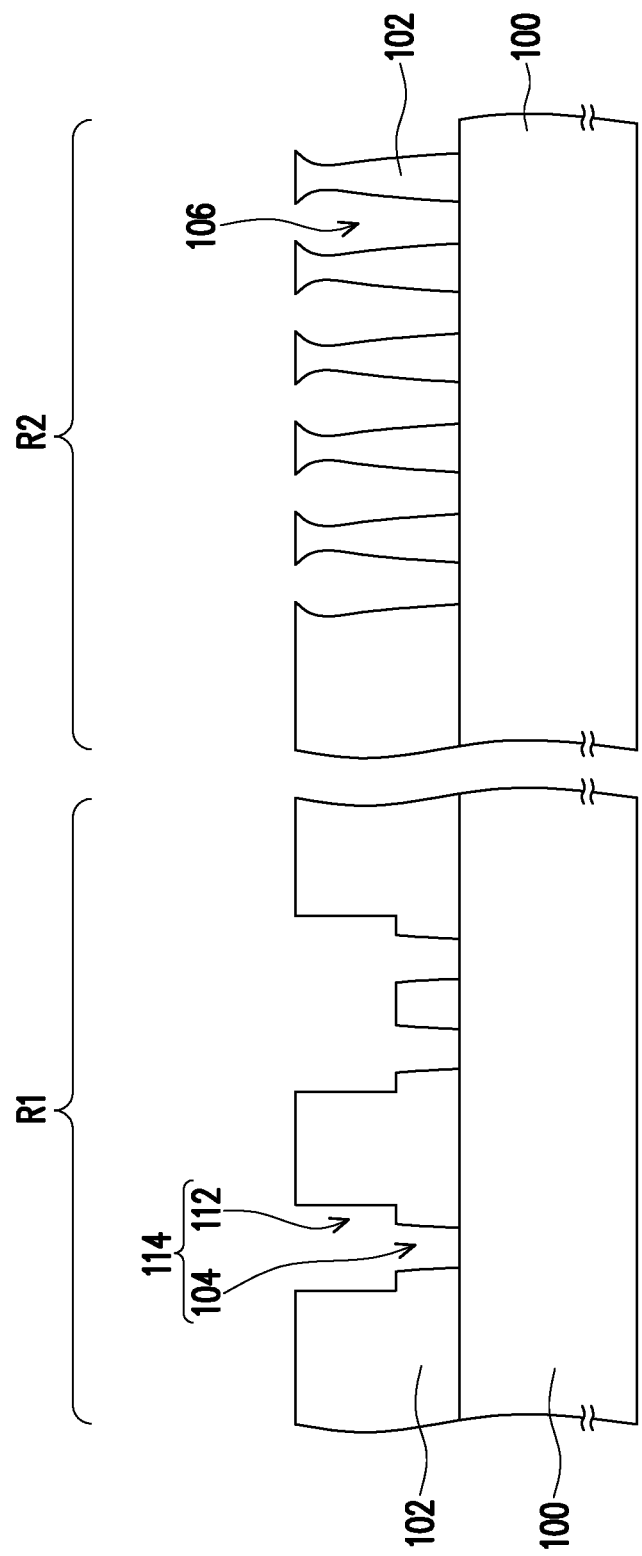

Referring to FIG. 1C, a portion of the dielectric layer 102 of the device area R1 may be removed using the patterned photoresist layer 110 as a mask, so as to form an opening 112. Thereby, a dual damascene opening 114 may be formed in the dielectric layer 102 of the device area R1. The dual damascene opening 114 includes the opening 104 and the opening 112 connected to each other. The opening 112 is located above the opening 104. The width of the opening 112 is greater than the width of the opening 104. The opening 112 is, for example, a trench. The aspect ratio of the opening 106 may be greater than the aspect ratio of the dual damascene opening 114.

The patterned photoresist layer 110 and the planarization layer 108 may be removed. The patterned photoresist layer 110 and the planarization layer 108 may be removed using an ashing process, but the invention is not limited thereto.

Figure 1D:
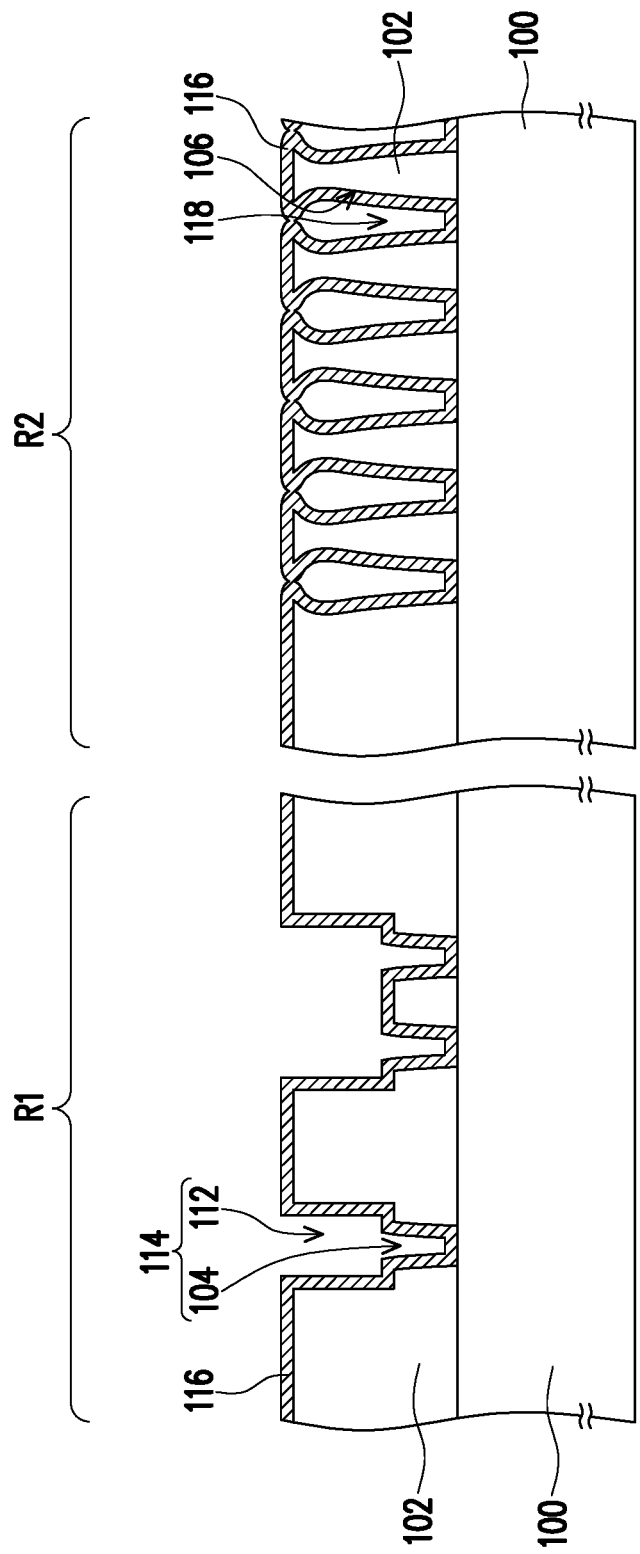

Referring to FIG. 1D, a barrier material layer 116 is formed on the surface of the dual damascene opening 114 and on the surface of the opening 106. The barrier material layer 116 seals the opening 106 to form a void 118 in the opening 106. The material of the barrier material layer 116 is, for example, Ti, TiN, Ta, TaN, or a combination thereof. The barrier material layer 116 may be conformally formed on the surface of the dual damascene opening 114 and on the surface of the opening 106. The barrier material layer 116 is formed by, for example, a physical vapor deposition method or a chemical vapor deposition method.

Moreover, the thickness of the barrier material layer 116 may be greater than half of the width of the top of the opening 106, whereby the barrier material layer 116 may seal the opening 106. The thickness of the barrier material layer 116 may be less than half of the width of the top of the dual damascene opening 114, whereby the barrier material layer 116 does not seal the dual damascene opening 114.

Figure 1E:
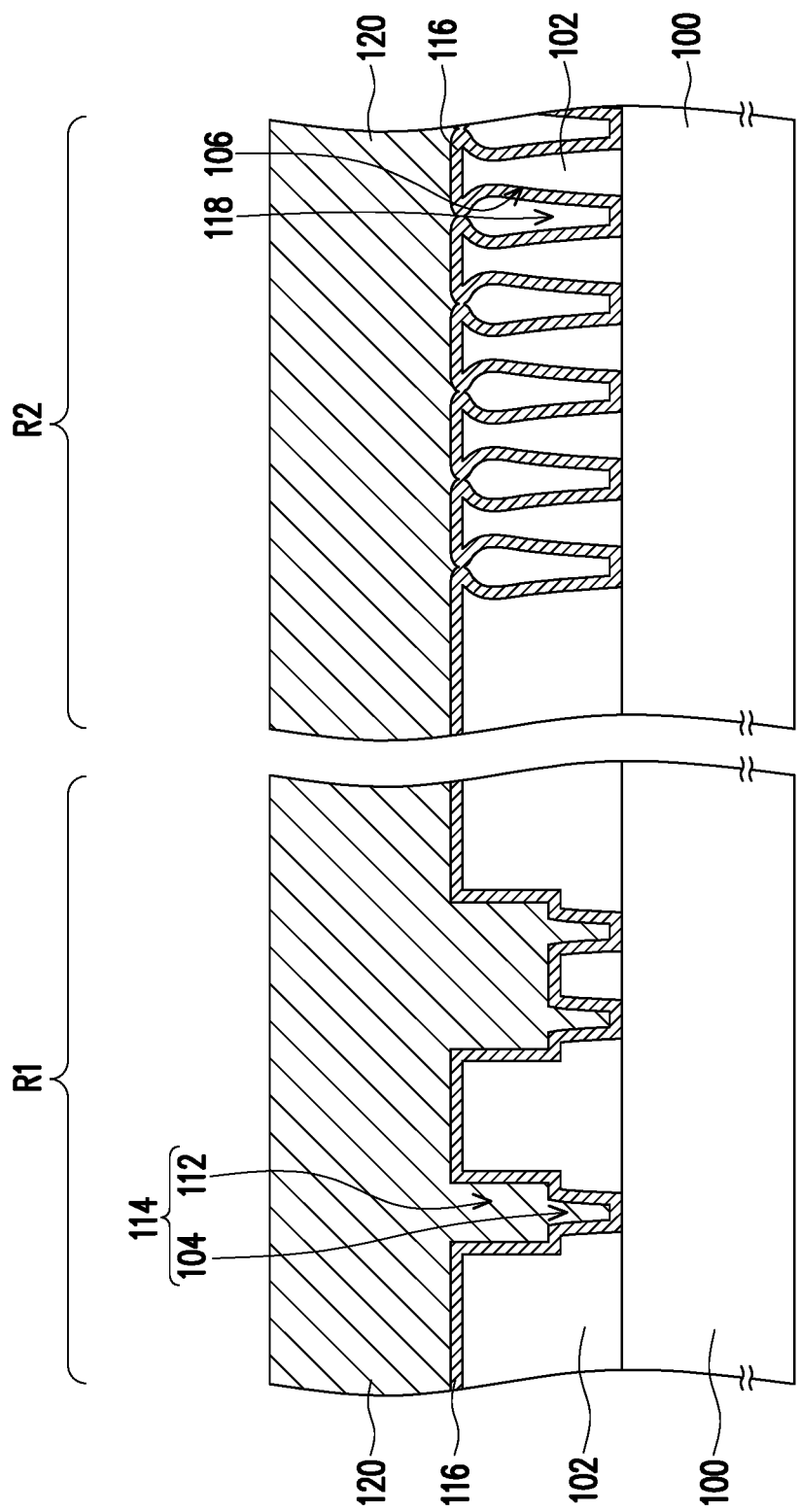

Referring to FIG. 1E, a metal material layer 120 is formed on the barrier material layer 116. The metal material layer 120 is filled in the dual damascene opening 114. In some embodiments, since the barrier material layer 116 seals the opening 106, the metal material layer 120 does not fill in the opening 106. The material of the metal material layer 120 is, for example, Cu. The method of forming the metal material layer 120 is, for example, a physical vapor deposition method or an electrochemical plating (ECP) method.

Figure 1F:
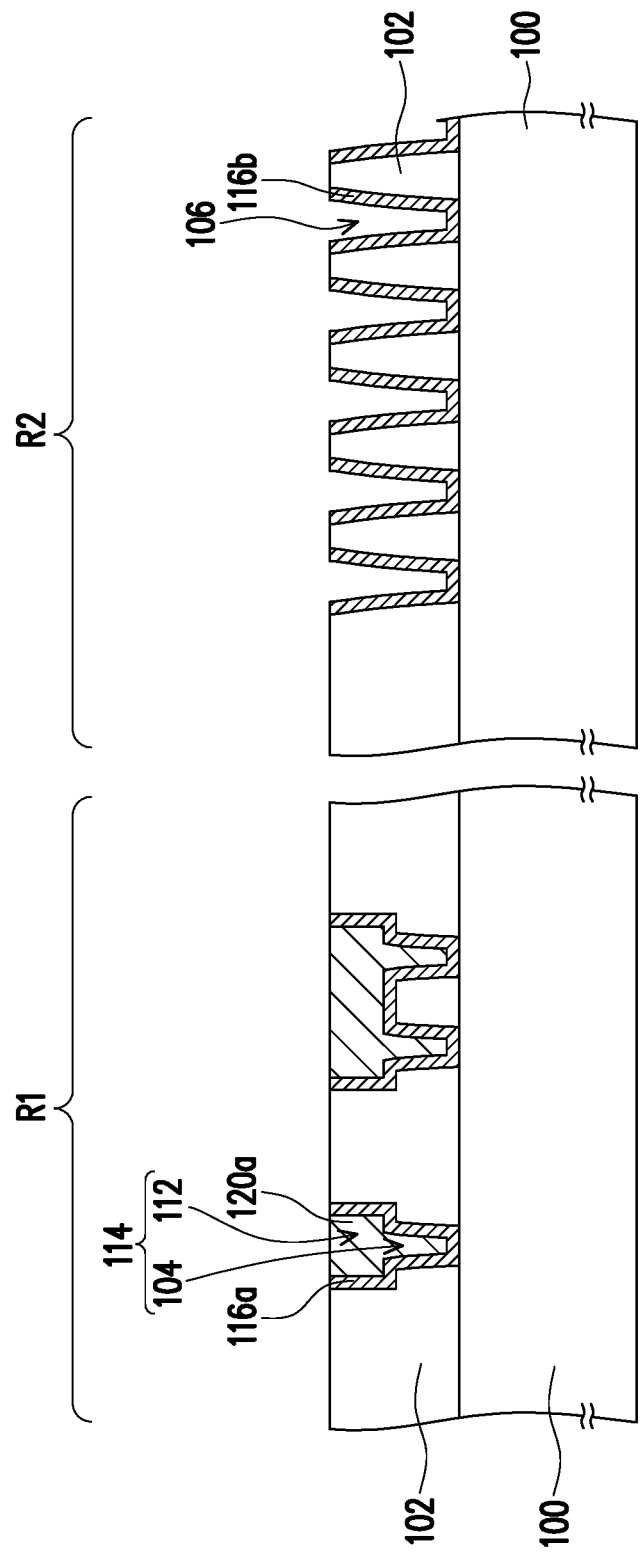

Referring to FIG. 1F, the metal material layer 120 and the barrier material layer 116 outside the dual damascene opening 114 and outside the opening 106 are removed to form a barrier layer 116a and a dual damascene structure 120a in the dual damascene opening 114, and to form a barrier layer 116b in the opening 106. The barrier layer 116b may be used as a mark, such as an alignment mark or an overlay mark. Moreover, in the step of removing the metal material layer 120 and the barrier material layer 116 outside the dual damascene opening 114 and outside the opening 106, a portion of the dielectric layer 102 may be removed to increase the width of the top of the opening 106. The method of removing the metal material layer 120 and the barrier material layer 116 outside the dual damascene opening 114 and outside the opening 106 is, for example, a chemical mechanical polishing method. In the case where the above removal step is performed by the chemical mechanical polishing method, a portion of the dielectric layer 102 may be removed by using an over-polish process to increase the width of the top of the opening 106.

In addition, the method of forming the dual damascene structure 120a may be a via-first dual damascene method or a trench-first dual damascene method. In the present embodiment, the method of forming the dual damascene structure 120a is exemplified by using the via-first dual damascene method, but the invention is not limited thereto. In the via-first dual damascene method, the opening 104 is formed first, and then the opening 112 is formed. In some embodiments, the method of forming the dual damascene structure 120a may be a trench-first dual damascene method. In the trench-first dual damascene method, the opening 112 is formed first, and then the opening 104 is formed. The trench-first dual damascene method is a method well known to persons of ordinary skill in the art and will not be described herein.

Figure 1G:
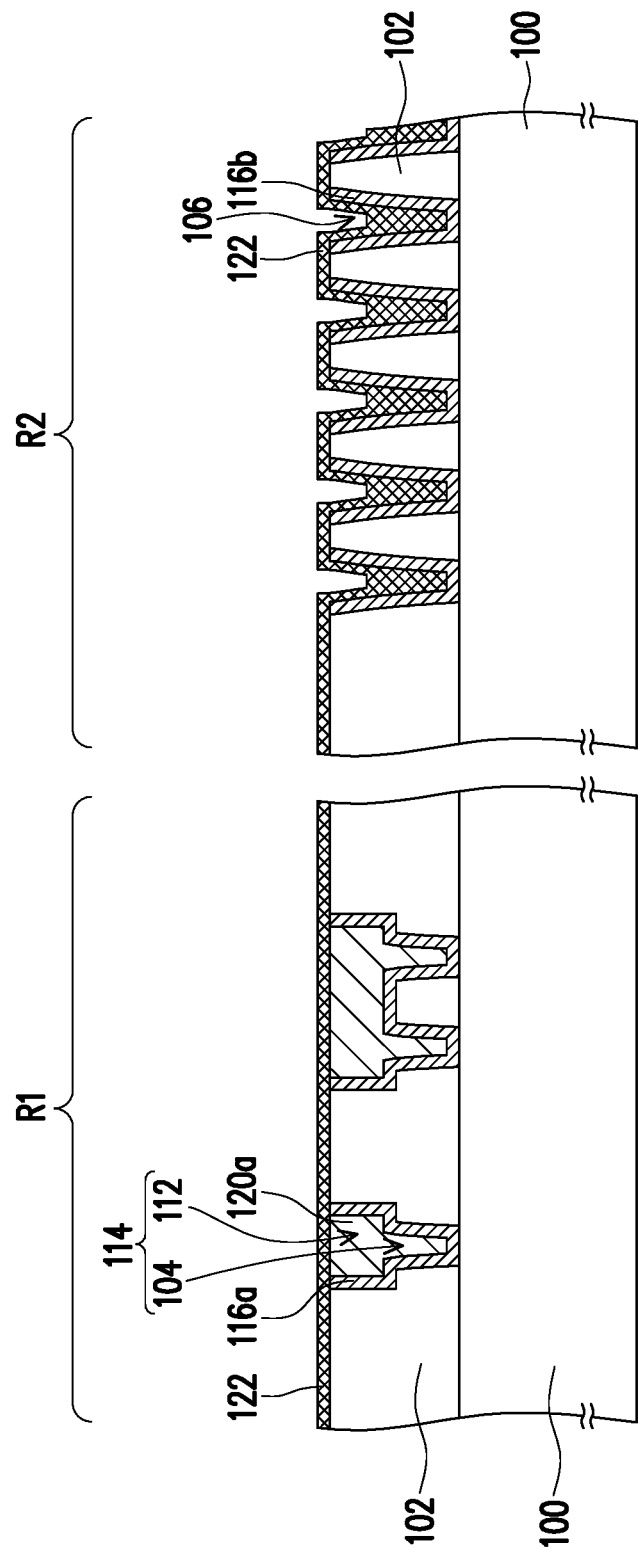

Referring to FIG. 1G, an opaque layer 122 may be formed on the barrier layer 116b. The opaque layer 122 may have a step difference at the position of the opening 106. The opaque layer 122 may be conformally formed on the barrier layer 116b. The material of the opaque layer 122 is, for example, Ta, TaN, Ti, TiN, Al, Cu, W, or a combination thereof. The method of forming the opaque layer 122 is, for example, a physical vapor deposition method or a chemical vapor deposition method.

Furthermore, the method of manufacturing the mark may be integrated with various semiconductor device processes, such as the process of a metal-insulator-metal (MIM) capacitor, a magnetoresistive random access memory (MRAM), or a metal hard mask.

Based on the above embodiment, in the method of manufacturing the mark, since the barrier material layer 116 seals the opening 106 to form the void 118 in the opening 106, the barrier layer 116b subsequently formed on the surface of the opening 106 may have a step difference, allowing the barrier layer 116b as the mark to generate a distinct mark signal. In addition, since the barrier material layer 116 seals the opening 106, it is possible to prevent the subsequently formed metal material layer 120 from filling the opening 106. In this way, even if the opaque layer 122 is formed on the barrier layer 116b in the subsequent process, the opaque layer 122 may have the step difference at the position of the opening 106, so that the distinct mark signal may still be generated. Furthermore, since the method of manufacturing the mark of the aforementioned embodiment may be integrated with a dual damascene process, the mark may be produced without the need to add an additional mask.

Based on the above, the method of manufacturing the mark of the aforementioned embodiment may produce the mark capable of generating the distinct mark signal. In addition, even if the opaque layer is formed on the mark in the subsequent process, the opaque layer may have the step difference at the position of the opening, so that the distinct mark signal may still be generated. Furthermore, the method of manufacturing the mark of the aforementioned embodiment may be integrated with the dual damascene process without the need to add an additional mask.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing a mark, comprising:
providing a substrate, wherein the substance comprises a device area and a mark area;
forming a dielectric layer on the substrate;
forming a dual damascene opening in the dielectric layer of the device area, wherein the dual damascene opening comprises a first opening and a second opening connected to each other, the second opening is located above the first opening, and a width of the second opening is greater than a width of the first opening;
forming a third opening in the dielectric layer of the mark area, wherein the third opening and the first opening are simultaneously formed by a same process;
forming a barrier material layer on a surface of the dual damascene opening and on a surface of the third opening, wherein the barrier material layer seals the third opening to form a void in the third opening;
forming a metal material layer on the barrier material layer, wherein the metal material layer is filled in the dual damascene opening; and
removing the metal material layer and the barrier material layer outside the dual damascene opening and outside the third opening to form a first barrier layer and a dual damascene structure in the dual damascene opening, and to form a second barrier layer in the third opening.

2. The method of manufacturing the mark according to claim 1, wherein an aspect ratio of the third opening is greater than an aspect ratio of the dual damascene opening.

3. The method of manufacturing the mark according to claim 1, wherein the first opening comprises a via opening.

4. The method of manufacturing the mark according to claim 1, wherein the second opening comprises a trench.

5. The method of manufacturing the mark according to claim 1, wherein the third opening comprises a via opening.

6. The method of manufacturing the mark according to claim 1, wherein a material of the barrier material layer comprises titanium, titanium nitride, tantalum, tantalum nitride, or a combination thereof.

7. The method of manufacturing the mark according to claim 1, wherein the barrier material layer is conformally formed on the surface of the dual damascene opening and on the surface of the third opening.

8. The method of manufacturing the mark according to claim 1, wherein the method of forming the barrier material layer comprises a physical vapor deposition method or a chemical vapor deposition method.

9. The method of manufacturing the mark according to claim 1, wherein a thickness of the barrier material layer is greater than half of a width of a top of the third opening.

10. The method of manufacturing the mark according to claim 1, wherein a thickness of the barrier material layer is less than half of a width of a top of the dual damascene opening.

11. The method of manufacturing the mark according to claim 1, wherein a material of the metal material layer comprises copper.

12. The method of manufacturing the mark according to claim 1, wherein a method of forming the metal material layer comprises a physical vapor deposition method or an electrochemical plating method.

13. The method of manufacturing the mark according to claim 1, wherein a method of removing the metal material layer and the barrier material layer outside the dual damascene opening and outside the third opening comprises a chemical mechanical polishing method.

14. The method of manufacturing the mark according to claim 1, wherein in the step of removing the metal material layer and the barrier material layer outside the dual damascene opening and outside the third opening, a portion of the dielectric layer is removed to increase a width of a top of the third opening.

15. The method of manufacturing the mark according to claim 1, wherein a method of forming the dual damascene structure comprises a via-first dual damascene method or a trench-first dual damascene method.

16. The method of manufacturing the mark according to claim 1, further comprising:
forming an opaque layer on the second barrier layer.

17. The method of manufacturing the mark according to claim 16, wherein a material of the opaque layer comprises tantalum, tantalum nitride, titanium, titanium nitride, aluminum, copper, tungsten, or a combination thereof.

18. The method of manufacturing the mark according to claim 16, wherein the opaque layer has a step difference at a position of the third opening.

19. The method of manufacturing the mark according to claim 16, wherein the opaque layer is conformally formed on the second barrier layer.

20. The method of manufacturing the mark according to claim 16, wherein a method of forming the opaque layer comprises a physical vapor deposition method or a chemical vapor deposition method.

* * * * *